(12) United States Patent
Toyota

(10) Patent No.: US 10,840,879 B2
(45) Date of Patent: Nov. 17, 2020

(54) SURFACE ACOUSTIC WAVE DEVICE

(71) Applicant: Murata Manufacturing Co., Ltd., Nagaokakyo (JP)

(72) Inventor: Yuji Toyota, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 502 days.

(21) Appl. No.: 15/667,751

(22) Filed: Aug. 3, 2017

(65) Prior Publication Data
US 2017/0359049 A1    Dec. 14, 2017

Related U.S. Application Data

(63) Continuation of application No. PCT/JP2016/053105, filed on Feb. 2, 2016.

(30) Foreign Application Priority Data

Mar. 16, 2015 (JP) .................................. 2015-052365

(51) Int. Cl.
*H03H 9/10* (2006.01)
*H03H 9/25* (2006.01)
*H03H 9/05* (2006.01)

(52) U.S. Cl.
CPC .......... *H03H 9/1071* (2013.01); *H03H 9/059* (2013.01); *H03H 9/25* (2013.01)

(58) Field of Classification Search
CPC ... H03H 9/1071; H03H 9/059; H03H 9/02535
(Continued)

(56) References Cited

U.S. PATENT DOCUMENTS

2007/0252481 A1* 11/2007 Iwamoto .............. H03H 9/0576
310/344
2010/0225202 A1    9/2010 Fukano et al.
(Continued)

FOREIGN PATENT DOCUMENTS

JP          09-74329 A      3/1997
JP       2003-124398 A      4/2003
(Continued)

OTHER PUBLICATIONS

Official Communication issued in International Patent Application No. PCT/JP2016/053105, dated Apr. 19, 2016.
(Continued)

*Primary Examiner* — Derek J Rosenau
(74) *Attorney, Agent, or Firm* — Keating & Bennett, LLP

(57) ABSTRACT

A surface acoustic wave device includes a piezoelectric substrate with an IDT electrode that excites a surface acoustic wave provided on a principal surface, a cover layer opposing the principal surface and that covers the IDT electrode, a support provided in a standing manner around the IDT electrode on the one principal surface, and that, with the cover layer separated from the IDT electrode, supports a piezoelectric-substrate-side surface of the cover layer, and a connector that is provided on the piezoelectric-substrate-side surface of the cover layer and that joins the cover layer and the support to each other. At least a portion of a cover-layer-side end portion of the support exists in the connector. A dimension of the connector in a normal direction to the one principal surface is less than a dimension of the support in the normal direction.

20 Claims, 6 Drawing Sheets

(58) Field of Classification Search
USPC ..... 310/313 R, 313 A, 313 B, 313 C, 313 D, 310/348
See application file for complete search history.

(56) References Cited

U.S. PATENT DOCUMENTS

| | | | |
|---|---|---|---|
| 2010/0289600 A1* | 11/2010 | Takada | H03H 9/0523 |
| | | | 333/193 |
| 2010/0327694 A1 | 12/2010 | Omote et al. | |
| 2011/0018389 A1* | 1/2011 | Fukano | H03H 9/059 |
| | | | 310/313 R |
| 2011/0115339 A1* | 5/2011 | Makibuchi | H01L 23/10 |
| | | | 310/340 |
| 2011/0169377 A1 | 7/2011 | Kubota et al. | |
| 2012/0086309 A1* | 4/2012 | Yamaji | H03H 9/1092 |
| | | | 310/313 B |
| 2014/0191617 A1 | 7/2014 | Ohashi et al. | |
| 2015/0042207 A1 | 2/2015 | Hori et al. | |

FOREIGN PATENT DOCUMENTS

| | | |
|---|---|---|
| JP | 2006-333130 A | 12/2006 |
| JP | 2011-142587 A | 7/2011 |
| JP | 5120446 B2 | 1/2013 |
| JP | 2014-007727 A | 1/2014 |
| KR | 10-2014-0140634 A | 12/2014 |
| WO | 2009/057699 A1 | 5/2009 |
| WO | 2009/116222 A1 | 9/2009 |
| WO | 2009/157587 A1 | 12/2009 |

OTHER PUBLICATIONS

Official Communication issued in Korean Patent Application No. 10-2017-7018877, dated Jun. 4, 2018.

\* cited by examiner

FIG. 1
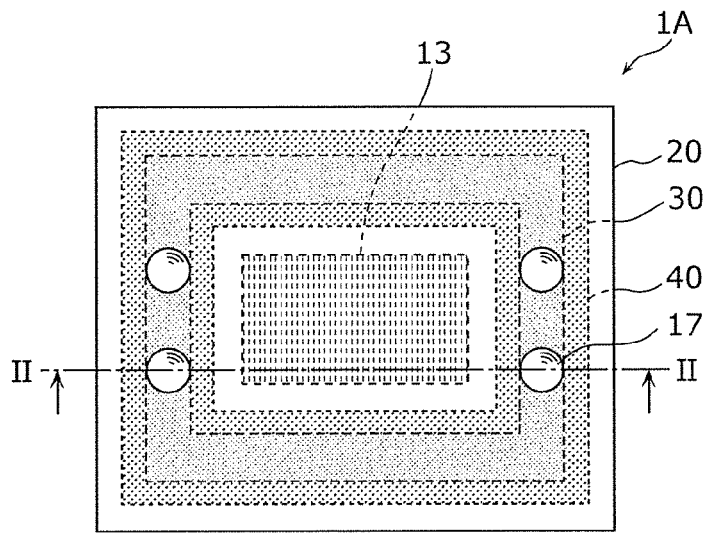
FIG. 2
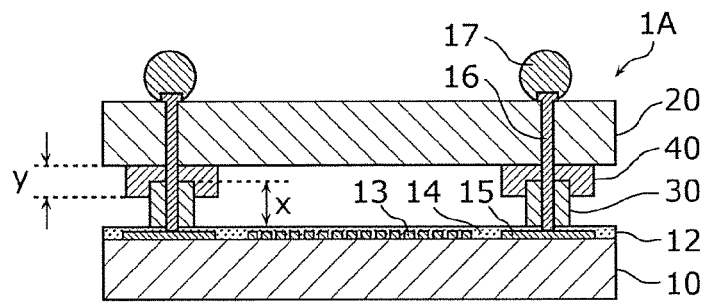
FIG. 3
| Material | Young's modulus (GPa) |
|---|---|
| polyimide | 3~5 |
| epoxy | 2.6~3 |
| BCB | 2.3~2.9 |
| PBO | 2.8~3.3 |
| Si | 107 |
| SiO2 | 35-45 |
| LiTaO3 | 233 |
| LiNbO3 | 204 |
| metal | several tens to several hundreds |

SURFACE ACOUSTIC WAVE DEVICE

CROSS REFERENCE TO RELATED APPLICATIONS

This application claims the benefit of priority to Japanese Patent Application No. 2015-052365 filed on Mar. 16, 2015 and is a Continuation Application of PCT Application No. PCT/JP2016/053105 filed on Feb. 2, 2016. The entire contents of each application are hereby incorporated herein by reference.

BACKGROUND OF THE INVENTION

1. Field of the Invention

The present invention relates to a surface acoustic wave device that excites a surface acoustic wave by using an electrode that is provided on a piezoelectric substrate.

2. Description of the Related Art

Hitherto, a surface acoustic wave device has been used as a bandpass filter used in an RF (Radio Frequency) circuit of, for example, a communication apparatus. Since there is a demand for reducing the size and thickness of communication apparatuses, such as cellular phones, measures are being taken to reduce the size and thickness of components, such as surface acoustic wave devices. In surface acoustic wave devices, as a package structure for reducing the size and thickness, a WLP (Wafer Level Package) structure is proposed (for example, International Publication No. 2009/116222 and Japanese Unexamined Patent Application Publication No. 2014-7727).

FIG. 17 is a sectional view of a surface acoustic wave device 501 having the WLP structure disclosed in International Publication No. 2009/116222, and FIG. 18 is a sectional view of a surface acoustic wave device 502 having the WLP structure disclosed in Japanese Unexamined Patent Application Publication No. 2014-7727. As shown in FIG. 17, the surface acoustic wave device 501 includes a piezoelectric substrate 511 where an IDT (Inter Digital Transducer) electrode 513 is provided, a support 531, and a cover layer 521. As shown in FIG. 18, the surface acoustic wave device 502 includes a piezoelectric substrate 512 where an IDT electrode 514 is provided, a support 532, and a cover layer 522. In the surface acoustic wave device 501, the support 531 and the cover layer 521 cover a region where the IDT electrode 513 is formed, and provide a hollow space above the IDT electrode 514 so as not to obstruct vibration of, for example, the IDT electrode. In the surface acoustic wave device 502, the support 532 and the cover layer 522 cover a region where the IDT electrode 514 is formed, and provide a hollow space above the IDT electrode 514 so as not to obstruct vibration of, for example, the IDT electrode. As described above, in a surface acoustic wave device having a WLP structure, size reduction is realized by using the piezoelectric substrate as a portion of the package.

In the surface acoustic wave device 501 disclosed in International Publication No. 2009/116222, as shown in FIG. 17, the cover layer 521 is laminated on the support 531. However, since the cover layer 521 is joined to the support 531 only at a cover-layer-521-side end surface of the support 531, the joining strength between the cover layer 521 and the support 531 is not sufficient. That is, the strength of the package structure is not sufficient.

On the other hand, in the surface acoustic wave device 502 disclosed in Japanese Unexamined Patent Application Publication No. 2014-7727, as shown in FIG. 18, the cover layer 522 is joined to the support 532 at a cover-layer-522-side end surface of the support 532 and an inner wall of the support 532. Accordingly, since the joining area between the cover layer 522 and the support 532 is large, the joining strength between the cover layer 522 and the support 532 is greater than that in the surface acoustic wave device 501 disclosed in International Publication No. 2009/116222.

However, in the surface acoustic wave device 502 disclosed in Japanese Unexamined Patent Application Publication No. 2014-7727, the inner wall of the support 532 and the cover layer 522 are joined to each other by heating the cover layer 522 and causing the cover layer 522 to extend downward along the inner wall of the support 532. In this case, the cover layer 522 may contact the IDT electrode 514. When the cover layer 522 contacts the IDT electrode 514, a space cannot be provided above the IDT electrode 514. Therefore, the surface acoustic wave device 502 may not provide the desired characteristics.

SUMMARY OF THE INVENTION

Accordingly, preferred embodiments of the prevent invention provide surface acoustic wave devices that each provide a space above an IDT electrode and has a WLP structure having high strength.

A surface acoustic wave device according to a preferred embodiment of the present invention includes a piezoelectric substrate on whose one principal surface an electrode that excites a surface acoustic wave is provided, a cover layer that is disposed at a location opposing the one principal surface and that covers the electrode, a support that is provided in a standing manner around the electrode on the one principal surface, and that, with the cover layer separated from the electrode, supports a piezoelectric-substrate-side surface of the cover layer, and a connector that is provided on the piezoelectric-substrate-side surface of the cover layer and that joins the cover layer and the support to each other. At least a portion of a cover-layer-side end portion of the support exists in the connector. A dimension of the connector in a normal direction to the one principal surface is less than a dimension of the support in the normal direction.

According to such a structure, since the joining area between the support and the cover layer or the connector is able to be increased, it is possible to increase the joining strength between the support and the cover layer. Therefore, it is possible to realize a surface acoustic wave device having a WLP structure with high strength. In addition, since the dimension of the connector in the normal direction is smaller than the dimension of the support, even if the cover-layer-side end portion of the support reaches the piezoelectric-substrate-side surface of the cover layer, the connector does not contact the piezoelectric substrate. Therefore, a space is provided above the electrode.

A Young's modulus of a material of the support may be less than or equal to a Young's modulus of a material of the piezoelectric-substrate-side surface of the cover layer.

According to such a structure, the embedding of the support into the cover layer is significantly reduced or prevented. Therefore, movement of the piezoelectric-substrate-side surface of the cover layer towards the piezoelectric substrate is significantly reduced or prevented by a cover-layer-side end surface of the support. That is, it is possible to maintain the cover layer in a separated state from the electrode. Therefore, a space is provided above the electrode.

The cover-layer-side end portion of the support may have a protruding shape.

According to such a structure, in producing a surface acoustic wave device, the cover-layer-side end portion of the support is able to be easily embedded into the connector.

The support may contact the cover layer.

The support may not contact the cover layer.

The connector may be provided around a region of the piezoelectric-substrate-side surface of the cover layer facing the electrode.

According to such a structure, even if a piezoelectric-substrate-side end portion of the connector contacts the piezoelectric substrate due to, for example, manufacturing errors, a space is provided above the electrode.

The connector may include a plurality of layers laminated in the normal direction.

According to such a structure, it is possible to use at least some of the laminated layers for, for example, increasing the fluid tightness of a space above the electrode.

The cover layer may include a plurality of layers laminated in the normal direction.

According to such a structure, it is possible to use at least some of the laminated layers for, for example, increasing the fluid tightness of a space above the electrode. In addition, it is possible to use at least some of the laminated layers for printing or inscribing a product number or the like.

The connector may be made of a material containing at least one of epoxy, urethane, phenol, polyester, benzocyclobutene, and polybenzoxazole.

The support may be made of a material containing at least one of polyimide, epoxy, benzocyclobutene, polybenzoxazole, a metal, and silicon oxide.

The piezoelectric-substrate-side surface of the cover layer may be made of a material containing at least one of polyimide, epoxy, benzocyclobutene, polybenzoxazole, silicon, silicon oxide, lithium tantalate, and lithium niobate.

According to various preferred embodiments of the present invention, it is possible to provide surface acoustic wave devices that each provide a vibration space above the IDT electrode and has a WLP structure having sufficient strength.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1 is a top view of a surface acoustic wave device according to a first preferred embodiment of the present invention.

FIG. 2 is a sectional view of the surface acoustic wave device according to the first preferred embodiment of the present invention.

FIG. 3 is a graph of examples of usable materials of a cover layer and a support of the surface acoustic wave device according to the first preferred embodiment of the present invention, and Young's modulus of each of these materials.

DETAILED DESCRIPTION OF THE PREFERRED EMBODIMENTS

Figure 4:
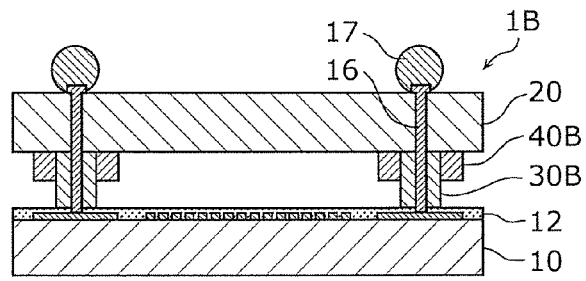
FIG. 4 is a sectional view of a surface acoustic wave device according to a first modification of the first preferred embodiment of the present invention.

Preferred embodiments of the present invention are described in detail below by using the drawings. The preferred embodiments that are described below are each comprehensive or specific examples. For example, numerical values, shapes, materials, structural elements, arrangements of the structural elements, and forms of connections of the structural elements are examples, and are not intended to limit the present invention. Of the structural elements according to the preferred embodiments below, the structural elements that are not described in the independent claim are described as optional structural elements. The sizes and size ratios of the structural elements shown in the drawings are not necessarily exact sizes and size ratios.

First Preferred Embodiment

First, a surface acoustic wave device according to a first preferred embodiment of the present invention is described with reference to the drawings.

FIG. 1 is a top view of a surface acoustic wave device 1A according to this preferred embodiment.

FIG. 2 is a sectional view of the surface acoustic wave device 1A according to this preferred embodiment. FIG. 2 shows a section of the surface acoustic wave device 1A along line II-II in FIG. 1.

As shown in FIGS. 1 and 2, the surface acoustic wave device 1A according to this preferred embodiment includes a piezoelectric substrate 10, an electrode section 12, a through conductor 16, solder bumps 17, a cover layer 20, a support 30, and a connector 40.

The piezoelectric substrate 10 is a substrate on whose one principal surface an IDT electrode 13 that excites a surface acoustic wave is provided. In this preferred embodiment, as shown in top view of FIG. 1, the piezoelectric substrate 10 preferably has a rectangular or substantially rectangular shape, the length of a side thereof being approximately 1 mm, for example. However, the shape of the piezoelectric substrate 10 in top view is not limited to a rectangular or substantially rectangular shape, and thus may be arbitrarily chosen.

The piezoelectric substrate 10 is a substrate made of, for example, piezoelectric ceramics or piezoelectric single crystals, such as lithium tantalate ($LiTaO_3$), lithium niobate ($LiNbO_3$), or crystals.

The electrode section 12 includes a layer that includes the IDT electrode 13 that is provided on the piezoelectric substrate 10 and a wiring electrode 15 that is connected to the IDT electrode 13 (a connection between the IDT electrode 13 and the wiring electrode 15 is not shown).

The IDT electrode 13 is a comb electrode that excites a surface acoustic wave. The IDT electrode 13 is made of, for example, a metal, such as Ti, Al, Cu, Au, Pt, Ag, Pd, or Ni; or an alloy of these metals. The IDT electrode 13 may include a plurality of multilayer bodies made of any of the aforementioned metals or an alloy of these metals.

The wiring electrode 15 is an electrode that is connected to the IDT electrode 13. The wiring electrode 15 defines a portion of a wiring path that connects the IDT electrode 13 and an external wire of the surface acoustic wave device 1A to each other. The wiring electrode 15 is made of the same material as the IDT electrode 13.

The through conductor 16 is a conductive member that is connected to the IDT electrode 13 via the wiring electrode 15, and defines a portion of the wiring path that connects the wiring electrode 15 and the external wire to each other. The through conductor 16 is formed preferably by filling a hole extending through the cover layer 20, the connector 40, and the support 30 with a conductor. The through conductor 16 is made of the same material as the IDT electrode 13.

Each solder bump 17 is an external terminal that is connected to the IDT electrode 13 via the through conductor 16 and the wiring electrode 15.

A dielectric film 14 is a protective film that covers the IDT electrode 13 and the wiring electrode 15. The dielectric film 14 may be used to improve the characteristics of the surface acoustic wave device 1A. The dielectric film 14 is provided on the piezoelectric substrate 10 so as to cover the IDT electrode 13 and the wiring electrode 15. For example, the dielectric film 14 is made of a dielectric material, such as silicon oxide or silicon nitride.

The cover layer 20 is a layer that opposes the one principal surface of the piezoelectric substrate 10 and that covers a region where the IDT electrode 13 is provided. As shown in FIGS. 1 and 2, in this preferred embodiment, the cover layer 20 preferably has a rectangular or substantially rectangular shape in top view similarly to the piezoelectric substrate 10. However, the shape of the cover layer 20 in top view is not limited to a rectangular or substantially rectangular shape, and thus may be arbitrarily chosen. The shape of the cover layer 20 and the shape of the piezoelectric substrate 10 in top view may differ from each other. In this preferred embodiment, the cover layer 20 is made of, for example, a material that includes at least one of polyimide, epoxy, benzocyclobutene (BCB), polybenzoxazole (PBO), silicon, silicon oxide, $LiTaO_3$, and $LiNbO_3$.

The support 30 is a member that is provided in a standing manner around the IDT electrode 13 on the one principal surface of the piezoelectric substrate 10, and that, with the cover layer 20 separated from the IDT electrode 13, supports a piezoelectric-substrate-10-side surface of the cover layer 20. As shown in FIG. 1, although, in this preferred embodiment, the support 30 preferably has a rectangular or substantially rectangular ring shape in top view, the shape of the support 30 is not limited thereto. The support 30 only needs to have a shape that allows the support 30 to be provided at at least a portion of a portion surrounding the IDT electrode 13 and that allows the support 30 to support the cover layer 20. When the support 30 has a ring shape, and surrounds the IDT electrode 13, the support 30 and the cover layer 20 fluid-tightly close a space between the IDT electrode 13 and the cover layer 20. That is, it is possible to significantly reduce or prevent entry of a liquid, such as water, into the space above the IDT electrode 13. In this preferred embodiment, the Young's modulus of the material of the support 30 is less than or equal to the Young's modulus of the material of the piezoelectric-substrate-10-side surface of the cover layer 20. The relationship between the Young's modulus of the support 30 and the Young's modulus of the cover layer 20 is described in detail later. The material of the support 30 is not particularly limited to certain materials as long as the material has the Young's modulus mentioned above. The support 30 is made of, for example, a material containing at least one of polyimide, epoxy, BCB, PBO, a metal, and silicon oxide, in accordance with the material of the piezoelectric-substrate-10-side surface of the cover layer 20.

The connector 40 is a member that is provided on the piezoelectric-substrate-10-side surface of the cover layer 20 and joins the cover layer 20 and the support 30 to each other. Although the material of the connector 40 is not particularly limited to certain materials, it is desirable that the Young's modulus of the material of the connector 40 be less than the Young's modulus of the material of the support 30. This makes it possible to easily embed the support 30 into the connector 40. The connector 40 is made of, for example, a material containing at least one of epoxy, urethane, phenol, polyester, BCB, and PBO.

As described above, the surface acoustic wave device 1A according to this preferred embodiment has a WLP structure in which a space above the IDT electrode 13 is surrounded by the piezoelectric substrate 10, the cover layer 20, the support 30, and the connector 40. The structure of the WLP structure of the surface acoustic wave device 1A according to this preferred embodiment is described in detail below.

As shown in FIG. 2, in this preferred embodiment, a cover-layer-20-side end portion of the support 30 exists in the connector 40. That is, the support 30 is embedded in the connector from a piezoelectric-substrate-10-side end portion of the connector 40. This causes not only a cover-layer-20-side end surface of the support 30 to contact the connector 40, but also a side surface near the end surface (a surface that is parallel or substantially parallel to a normal direction to the principal surface of the piezoelectric substrate 10) to contact the connector 40. Therefore, the joining area between the support 30 and the connector 40 is larger than that when the support 30 contacts the connector 40 only at the cover-layer-20-side end surface of the support 30. Consequently, the joining strength between the support 30 and the connector 40 is increased. In addition, even regarding the joining between the connector 40 and the cover layer 20, the joining area between the connector 40 and the cover layer 20 is able to be made larger than the area of the cover-layer-20-side end surface of the support 30, so that it is possible to increase the joining strength. As described above, since the joining strength between the support 30 and the connector 40 and the joining strength between the connector 40 and the cover layer 20 are able to be increased, it is possible to realize a WLP structure having high strength.

In this preferred embodiment, the dimension of the connector 40 in the normal direction to the principal surface of the piezoelectric substrate 10 where the IDT electrode 13 is provided (a dimension y in FIG. 2) is less than the dimension of the support 30 in the normal direction (dimension x in FIG. 2). Therefore, even if the cover-layer-20-side end portion of the support 30 is further embedded into the connector 40 and reaches the piezoelectric-substrate-10-side surface of the cover layer 20, the piezoelectric-substrate-10-side end portion of the connector 40 does not contact the piezoelectric substrate 10. Therefore, a space is provided above the IDT electrode 13.

Further, in this preferred embodiment, as shown in FIGS. 1 and 2, the connector 40 is provided around a region of a piezoelectric-substrate-10-side surface of the cover layer 20 facing the IDT electrode 13. Therefore, even if the piezoelectric-substrate-10-side end portion of the connector 40 contacts the piezoelectric substrate 10 due to, for example, manufacturing errors, a space is provided above the IDT electrode 13.

Still further, in this preferred embodiment, as described above, the Young's modulus of the material of the support 30 is less than or equal to the Young's modulus of the material of the piezoelectric-substrate-10-side surface of the cover layer 20. Therefore, even if the cover-layer-20-side end portion of the support 30 extends through the connector 40 and reaches the cover layer 20, the embedding of the support 30 into the cover layer 20 is significantly reduced or prevented. Therefore, movement of the piezoelectric-substrate-10-side surface of the cover layer 20 towards the piezoelectric substrate 10 is significantly reduced or prevented by the cover-layer-side end surface of the support 30. That is, it is possible to maintain the cover layer 20 in a separated state from the IDT electrode 13. Therefore, a space is provided above the IDT electrode 13.

Combinations of the material of the cover layer 20 and the material of the support 30 that satisfy the aforementioned relationships regarding the Young's modulus are described by using FIG. 3.

FIG. 3 is a graph of examples of usable materials of the cover layer 20 and the support 30 of the surface acoustic wave device 1A according to this preferred embodiment, and Young's modulus of each of these materials.

Due to the relationships between the materials and their Young's moduli shown in FIG. 3, when, for example, polyimide is used as the material of the cover layer 20, for example, polyimide, epoxy, or BCB, whose Young's modulus is less than or equal to the Young's modulus of polyimide, can be used as the material of the support 30.

Next, an exemplary method of producing the surface acoustic wave device 1A according to this preferred embodiment is described.

First, the piezoelectric substrate 10 is prepared. In this preferred embodiment, for example, a 42°-Y-cut LiTaO$_3$ substrate is used.

Next, a resist pattern is formed on one principal surface of the piezoelectric substrate 10 by using a photolithographic technique. After forming a conductive film on the piezoelectric substrate 10 on which the resist pattern has been formed, the resist pattern is removed to form the IDT electrode 13 and the wiring electrode 15. In this preferred embodiment, for example, the IDT electrode 13 may be formed by forming a Ti film and an AlCu film from a side of the piezoelectric substrate 10; and, for example, the wiring electrode 15 may be formed by forming a Ti film and an Al film from the side of the piezoelectric substrate 10. The films that make up the IDT electrode 13 and the wiring electrode 15 can be formed by, for example, evaporation.

Next, the dielectric film 14 is formed on the piezoelectric substrate 10 so as to cover the IDT electrode 13 and the wiring electrode 15. In this preferred embodiment, for example, the dielectric film 14 is formed by forming a silicon oxide film by CVD (Chemical Vapor Deposition) or the like.

Next, the support 30 is formed on the principal surface of the piezoelectric substrate 10 where the IDT electrode 13 etc. have been formed in such a manner as to surround the IDT electrode 13. In this preferred embodiment, the support 30 is made of, for example, epoxy. The support 30 is formed by, for example, depositing photosensitive epoxy on the piezoelectric substrate 10 and forming a pattern of the support 30 by the photolithographic technique. The dimension of the support 30 in the normal direction to the principal surface of the piezoelectric substrate 10 is, for example, about 10 μm to about 20 μm. As shown in FIG. 2, the support 30 is formed on the wiring electrode 15.

Next, a sheet-shaped composite material including two layers, that is, the connector 40 and the cover layer 20, which have been previously laminated is attached to the support 30. The connector 40 is made of, for example, epoxy, and formed by patterning into a pattern corresponding to the support 30. The dimension of the connector 40 in the normal direction to the principal surface of the piezoelectric substrate 10 is, for example, about 5 μm to about 15 μm. The cover layer 20 is made of, for example, polyimide, and has the connector 40 joined thereto. The thickness of the cover layer 20 is, for example, about 10 μm to about 30 μm.

With the support 30 embedded in the connector 40, the cover layer 20 and the connector 40 attached to the support 30 are solidified under an environment of approximately 300° C. This causes the support 30 and the cover layer 20 to be joined to each other by the connector 40. In order to sufficiently embed the support 30 in the connector 40, pressure may be applied to the cover layer 20 and the connector 40 towards the piezoelectric substrate 10 prior to the solidifying step.

Next, a general description of a method of forming the through conductor 16 and the solder bumps 17 is given.

First, a portion where the cover layer 20 and the support 30 overlap each other is irradiated with laser light from a side of the cover layer 20. This causes a portion of the cover layer 20 and a portion of the support 30 to be removed and the wiring electrode 15 to be exposed at a location facing the cover layer 20.

Next, a plating power-feeding layer is formed from the side of the cover layer 20. The plating power-feeding layer includes a Ti layer and an Ni layer from a side of the wiring electrode 15. Next, a resist pattern is made to cover portions other than the portion that has been removed by the laser light.

Next, electroplating is performed using Ni to cause an Ni plating film to grow on a portion that is not covered by the laser pattern (that is, the portion removed by the laser light above). Then, in this state, electroplating using Au is performed to cause an Au plating film to grow on the Ni plating film.

Next, after removing the resist pattern, the plating power-feeding film is removed by etching. This causes the through conductor 16 to be formed.

Next, solder paste is applied to the Au plating by screen printing, and the solder bumps 17 are formed by performing a reflow step. Then, flux cleaning is performed.

As described above, it is possible to produce the surface acoustic wave device 1A shown in FIGS. 1 and 2. Ordinarily, a plurality of surface acoustic wave devices 1A are formed on a substrate and are divided into individual surface acoustic wave devices 1A by cutting with a dicing machine.

First Modification of First Preferred Embodiment

Next, a surface acoustic wave device according to a first modification of the first preferred embodiment is described with reference to the drawings.

FIG. 4 is a sectional view of a surface acoustic wave device 1B according to this modification.

As shown in FIG. 4, the surface acoustic wave device 1B according to this modification differs from the surface acoustic wave device 1A according to the first preferred embodiment in the structure of a connector 40B and the structure of a support 30B. The other structural features are the same. In the surface acoustic wave device 1B according to this modification, the support 30B extends through the connector 40B and contacts the cover layer 20. In the description, the state of the structure in which the support 30B extends through the connector 40B is defined as one form of an "embedded" state of the support 30B in the connector 40B.

Even in the surface acoustic wave device 1B according to this modification, similarly to the surface acoustic wave device 1A according to the first preferred embodiment, the support 30B contacts the connector 40B at a side surface of the support 30B near a cover-layer-20-side end surface thereof. In addition, the cover-layer-20-side end surface of the support 30B contacts the cover layer 20. Therefore, the support 30B is joined to the cover layer 20 at the cover-layer-20-side end surface and at the side surface of the support 30B near the end surface via the connector 40B. Therefore, the joining strength between the support 30B and the cover layer 20 is greater than that when the support 30B contacts the cover layer 20 only at the cover-layer-20-side end surface. Therefore, it is possible to realize a WLP structure having high strength.

Even in this modification, similarly to the first preferred embodiment, the dimension of the connector 40B in the normal direction to the principal surface of the piezoelectric substrate 10 where the IDT electrode 13 is provided is less than the dimension of the support 30B in the normal direction. Therefore, even if, as in this modification, the cover-layer-20-side end surface of the support 30B contacts the piezoelectric-substrate-10-side surface of the cover layer 20, a piezoelectric-substrate-10-side end portion of the connector 40B does not contact the piezoelectric substrate 10. Therefore, a space is provided above the IDT electrode 13.

Even in this modification, similarly to the first preferred embodiment, the Young's modulus of the material of the support 30B is less than or equal to the Young's modulus of the material of the piezoelectric-substrate-10-side surface of the cover layer 20. Therefore, even in this modification, similarly to the first preferred embodiment, it is possible to maintain the cover layer 20 in a separated state from the IDT electrode 13. Therefore, a space is provided above the IDT electrode 13.

Second Modification of First Preferred Embodiment

Next, a surface acoustic wave device according to a second modification of the first preferred embodiment is described with reference to the drawings.

Figure 5:
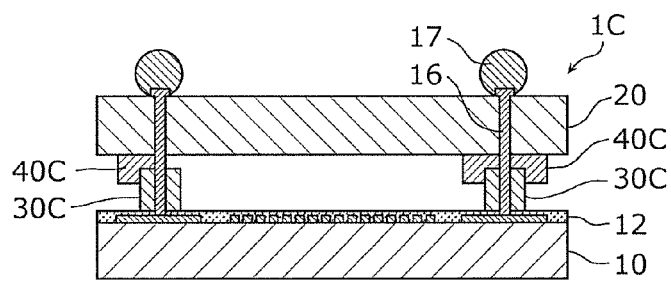
FIG. 5 is a sectional view of a surface acoustic wave device according to a second modification of the first preferred embodiment of the present invention.

FIG. 5 is a sectional view of a surface acoustic wave device 1C according to this modification.

As shown in FIG. 5, the surface acoustic wave device 1C according to this modification differs from the surface acoustic wave device 1A according to the first preferred embodiment in the structure of a connector 40C and the structure of a support 30C. The other structural features are the same. In the surface acoustic wave device 1C according to this modification, at least a portion of a cover-layer-20-side end surface of the support 30C is embedded in the connector 40C. The state of the structure in which only a portion of the cover-layer-20-side end surface of the support 30C is embedded in the connector 40C as in the positional relationship between the connector 40C and the support 30C shown on the left side of FIG. 5 is also defined as one form of an "embedded" state of the support 30C in the connector 40C.

Even in the surface acoustic wave device 1C according to this modification, similarly to the surface acoustic wave device 1A according to the first preferred embodiment, the support 30C contacts the connector 40C at a side surface of the support 30C near a cover-layer-20-side end surface thereof (a surface that is parallel to the normal direction to the principal surface of the piezoelectric substrate 10). In addition, at least a portion of the cover-layer-20-side end surface of the support 30C contacts the connector 40C. Therefore, the joining strength between the support 30 and the connector 40C is greater than that when the support 30C is joined to the connector 40C only at a portion of the cover-layer-20-side end surface. In addition, the joining area between the connector 40C and the cover layer 20 are able to be made larger than the area of the cover-layer-20-side end surface of the support 30C. Therefore, it is possible to realize a WLP structure having high strength.

Even in this modification, similarly to the first preferred embodiment, the dimension of the connector 40C in the normal direction to the principal surface of the piezoelectric substrate 10 where the IDT electrode 13 is provided is less than the dimension of the support 30C in the normal direction. In addition, the Young's modulus of the material of the support 30C is less than or equal to the Young's modulus of the material of the piezoelectric-substrate-10-side surface of the cover layer 20. Therefore, even in this modification, similarly to the first preferred embodiment, a space is provided above the IDT electrode 13.

Third Modification of First Preferred Embodiment

Next, a surface acoustic wave device according to a third modification of the first preferred embodiment is described with reference to the drawings.

Figure 6:
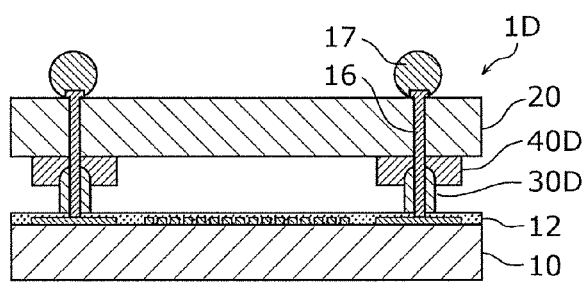
FIG. 6 is a sectional view of a surface acoustic wave device according to a third modification of the first preferred embodiment of the present invention.

FIG. 6 is a sectional view of a surface acoustic wave device 1D according to this modification.

As shown in FIG. 6, the surface acoustic wave device 1D according to this modification differs from the surface acoustic wave device 1A according to the first preferred embodiment in the structure of a support 30D. The other structural features are the same. In the surface acoustic wave device 1D according to this modification, a cover-layer-20-side end portion of the support 30D has a protruding curved shape in the direction of the cover layer 20.

Even in the surface acoustic wave device 1D according to this modification, similarly to the surface acoustic wave device 1A according to the first preferred embodiment, the support 30D is embedded in the connector 40D. The joining strength between the support 30D and the connector 40D is greater than that when the support 30D is joined to the connector 40D only at a cover-layer-20-side end. In addition, the joining area between the connector 40D and the cover layer 20 can be made larger than the area of the cover-layer-20-side end of the support 30D. Therefore, it is possible to realize a WLP structure having high strength. Further, since the support 30D has the above-described shape, when producing the surface acoustic wave device 1D, the cover-layer-20-side end portion of the support 30D is easily embedded into the connector 40D.

Even in this modification, similarly to the first preferred embodiment, the dimension of the connector 40D in the normal direction to the principal surface of the piezoelectric substrate 10 where the IDT electrode 13 is provided is less than the dimension of the support 30D in the normal direction. In addition, the Young's modulus of the material of the support 30D is less than or equal to the Young's modulus of the material of the piezoelectric-substrate-10-side surface of the cover layer 20. Therefore, even in this modification, similarly to the first preferred embodiment, a space is provided above the IDT electrode 13.

The method of forming the support 30D according to this modification is not particularly limited to certain methods. For example, when the support is formed by using photosensitive resin, it is possible to form the support 30D including an end portion that has a protruding curved surface by making a developing time longer than a usual developing time. In addition, the support 30D may be formed by performing physical etching, such as ion sputtering, on the end portion of the support. Further, the support 30D may be formed by forming the support such that the width (that is, the width in a left-right direction in FIG. 6) of the support is small. In this case, the width of the support 30D is determined as appropriate in accordance with the material of the support 30D.

Fourth Modification of First Preferred Embodiment

Next, a surface acoustic wave device according to a fourth modification of the first preferred embodiment is described with reference to the drawings.

Figure 7A:
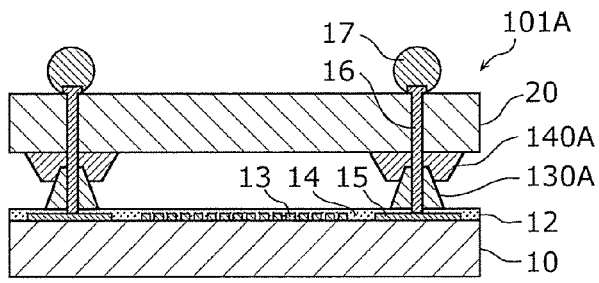
FIG. 7A is a sectional view of a surface acoustic wave device according to a first example of a fourth modification of the first preferred embodiment of the present invention.

FIG. 7A is a sectional view of a surface acoustic wave device 101A according to a first example of this modification.

Figure 7B:
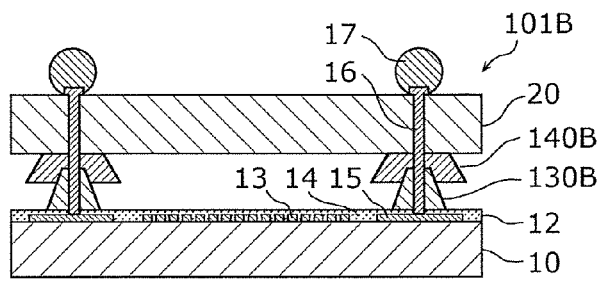
FIG. 7B is a sectional view of a surface acoustic wave device according to a second example of the fourth modification of the first preferred embodiment of the present invention.

FIG. 7B is a sectional view of a surface acoustic wave device 101B according to a second example of this modification.

Figure 7C:
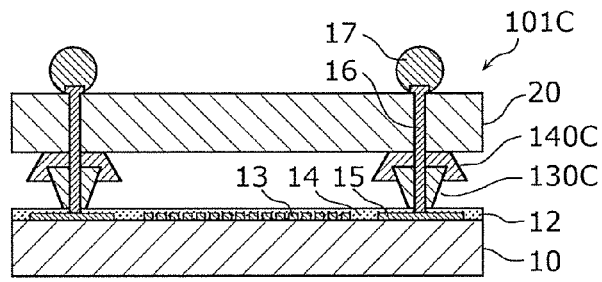
FIG. 7C is a sectional view of a surface acoustic wave device according to a third example of the fourth modification of the first preferred embodiment of the present invention.

FIG. 7C is a sectional view of a surface acoustic wave device 101C according a third example of this modification.

Figure 7D:
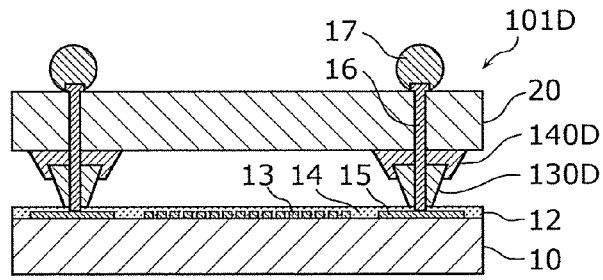
FIG. 7D is a sectional view of a surface acoustic wave device according to a fourth example of the fourth modification of the first preferred embodiment of the present invention.

FIG. 7D is a sectional view of a surface acoustic wave device 101D according to a fourth example of this modification.

As shown in FIGS. 7A to 7D, the surface acoustic wave devices 101A to 101D according to this modification differ from the surface acoustic wave device 1A according to the first preferred embodiment in that supports 130A to 130D and connectors 140A to 140D each have a tapering shape. The other structural features are the same.

In each of the support 130A shown in FIG. 7A and the support 130B shown in FIG. 7B, the width (that is, the width in the left-right direction in FIGS. 7A and 7B) decreases gradually from a side of the piezoelectric substrate 10 to a side of the cover layer 20. In contrast, in each of the support 130C shown in FIG. 7C and the support 130D shown in FIG. 7D, the width increases gradually from the side of the piezoelectric substrate 10 to the side of the cover layer 20.

In each of the connector 140A shown in FIG. 7A and the connector 140D shown in FIG. 7D, the width increases gradually from the side of the piezoelectric substrate 10 to the side of the cover layer 20. In contrast, in each of the connector 140B shown in FIG. 7B and the connector 140C shown in FIG. 7C, the width decreases gradually from the side of the piezoelectric substrate 10 to the side of the cover layer 20.

Even in the surface acoustic wave devices 101A to 101D according to this modification, similarly to the surface acoustic wave device 1A according to the first preferred embodiment, the supports 130A to 130D are embedded in the corresponding connectors 140A to 140D. Therefore, the joining strengths between the supports 130A to 130D and the corresponding connectors 140A to 140D are greater than those when each of the supports 130A to 130D is joined to a corresponding one of the connectors 140A to 140D only at a cover-layer-20-side end thereof. In addition, the joining area between each of the connectors 140A to 140D and the cover layer 20 is able to be made larger than the area of the cover-layer-20-side end of a corresponding one of the supports 130A to 130D. Therefore, it is possible to realize a WLP structure having high strength.

Further, in the first and second examples of this modification, by forming the supports 130A and 130B in the aforementioned corresponding shapes, when the surface acoustic wave devices 101A and 101B are to be produced, a cover-layer-20-side end portion of the support 130A and a cover-layer-20-side end portion of the support 130B can be easily embedded into the connector 140A and the connector 140B, respectively. Therefore, when the support 130A and the support 130B are to be joined to the connector 140A and the connector 140B, respectively, it is possible to reduce the pressure applied to the piezoelectric substrate 10 and the cover layer 20. This makes it possible to reduce breakage and deformation of the cover layer 20 and the piezoelectric substrate 10 in the surface acoustic wave device 101A according to the first example and the surface acoustic wave device 101B according to the second example of this modification.

In the third and fourth examples of this modification, by forming the supports 130C and 130D in the aforementioned corresponding shapes, the joining area between the support and the connector according to the third example and the joining area between the support and the connector according to the fourth example are able to be kept equivalent to the joining area in the surface acoustic wave device 1A according to the first preferred embodiment. Moreover, it is possible to reduce the exclusive area of each support on the corresponding piezoelectric substrate 10. Consequently, in the surface acoustic wave devices 101C and 101D according to the third example and the fourth example of this modification, it is possible to reduce the size of the piezoelectric substrate 10.

Even in this modification, similarly to the first preferred embodiment, the dimension of each connector in the normal direction to the principal surface of the piezoelectric substrate where the IDT electrode 13 is provided is less than the dimension of each support in the normal direction. The Young's modulus of the material of each support is less than or equal to the Young's modulus of the material of the piezoelectric-substrate-10-side surface of the corresponding cover layer 20. Therefore, even in this modification, similarly to the first preferred embodiment, a space is provided above the IDT electrode 13.

A method of forming each support and each connector according to this modification is not particularly limited to certain methods. For example, each support and each connector may be shaped into tapering shapes by performing physical etching, such as ion sputtering, on each support and each connector.

Although, in the examples shown in FIGS. 7A to 7D, each support and each connector have tapering shapes, the structure of this modification is not limited to these examples. For example, only one of the support and the connector may have a tapering shape.

Further, when photosensitive resin is used for the members, the tapering shapes or reverse tapering shapes may be formed by controlling exposure conditions (focus, exposure amount) of photolithography.

Second Preferred Embodiment

Next, a surface acoustic wave device according to a second preferred embodiment of the present invention is described with reference to the drawings.

Figure 8:
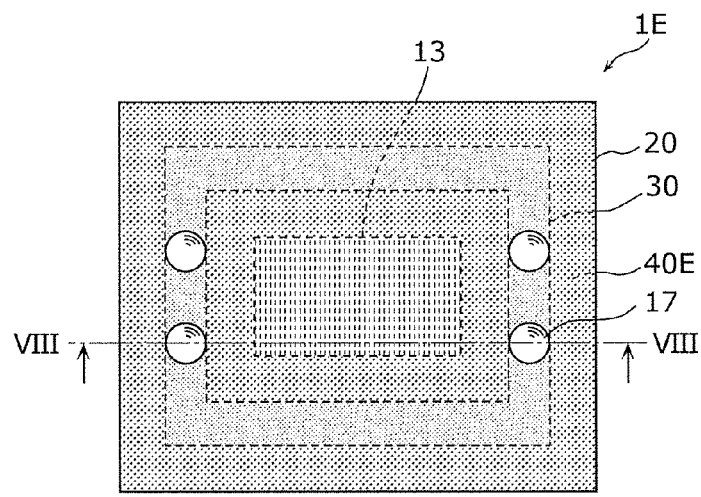
FIG. 8 is a top view of a surface acoustic wave device according to a second preferred embodiment of the present invention.

FIG. 8 is a top view of a surface acoustic wave device 1E according to the second preferred embodiment.

Figure 9:
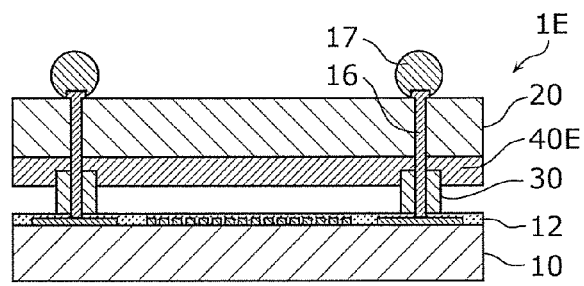
FIG. 9 is a sectional view of the surface acoustic wave device according to the second preferred embodiment of the present invention.

FIG. 9 is a sectional view of the surface acoustic wave device 1E according to this preferred embodiment. FIG. 9 shows a section of the surface acoustic wave device 1E along line VIII-VIII in FIG. 8.

As shown in FIGS. 8 and 9, the surface acoustic wave device 1E according to this preferred embodiment differs from the surface acoustic wave device 1A according to the first preferred embodiment in the shape of a connector 40E. The other structural features are the same. More specifically, the connector 40E according to this preferred embodiment is not patterned, and has a sheet shape that is similar to the shape of a cover layer 20 in top view. Therefore, in producing the connector 40E according to the present preferred embodiment, patterning is not required. Consequently, it is possible to reduce required production costs and time compared to when the connector 40 according to the first preferred embodiment is produced.

Even in this preferred embodiment, the dimension of the connector 40E in a normal direction to a principal surface of a piezoelectric substrate 10 where an IDT electrode 13 is provided is less than the dimension of a support 30 in the normal direction. Therefore, even if the connector 40E is provided above the IDT electrode 13 as in this preferred embodiment, a space is provided above the IDT electrode 13.

Even in the surface acoustic wave device 1E according to this preferred embodiment, similarly to, for example, the surface acoustic wave device 1A according to the first preferred embodiment, it is possible to realize a WLP structure having high strength.

First Modification of Second Preferred Embodiment

Next, a surface acoustic wave device according to a first modification of the second preferred embodiment is described with reference to the drawings.

Figure 10:
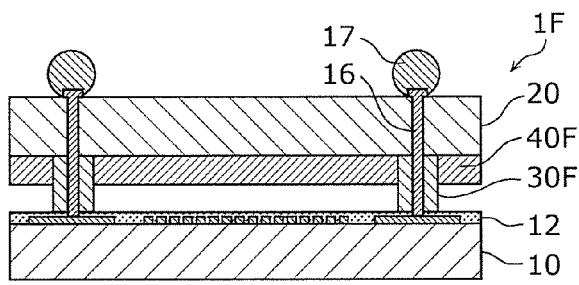
FIG. 10 is a sectional view of a surface acoustic wave device according to a first modification of the second preferred embodiment of the present invention.

FIG. 10 is a sectional view of a surface acoustic wave device 1F according to this modification.

As shown in FIG. 10, the surface acoustic wave device 1F according to this modification differs from the surface acoustic wave device 1E according to the second preferred embodiment in the structure of a connector 40F and the structure of a support 30F. The other structural features are the same. In the surface acoustic wave device 1F according to this modification, the support 30F extends through the connector 40F and contacts the cover layer 20.

Even in this preferred embodiment, the dimension of the connector 40F in the normal direction to the principal surface of the piezoelectric substrate 10 where the IDT electrode 13 is provided is less than the dimension of the support 30F in the normal direction. Therefore, even in the surface acoustic wave device 1F according to this modification, similarly to the surface acoustic wave device 1B according to the first modification of the first preferred embodiment, it is possible to realize a WLP structure having high strength. The other effects of the surface acoustic wave device 1F are similar to those of the surface acoustic wave device 1E according to the second preferred embodiment.

Second Modification of Second Preferred Embodiment

Next, a surface acoustic wave device according to a second modification of the second preferred embodiment is described with reference to the drawings.

Figure 11:
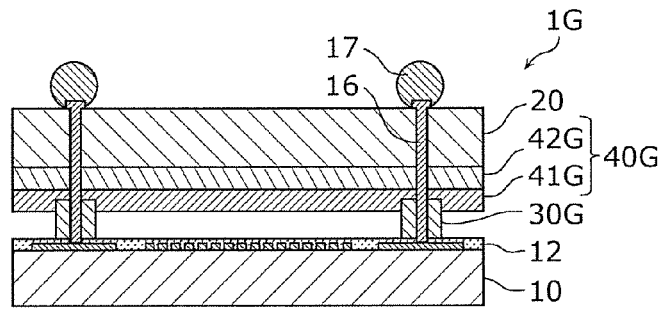
FIG. 11 is a sectional view of a surface acoustic wave device according to a second modification of the second preferred embodiment of the present invention.

FIG. 11 is a sectional view of a surface acoustic wave device 1G according to this modification.

As shown in FIG. 11, the surface acoustic wave device 1G according to this modification differs from the surface acoustic wave device 1E according to the second preferred embodiment in the structure of a connector 40G and the structure of a support 30G. The other structural features are the same. The connector 40G according to this modification includes a plurality of layers that are laminated in the normal direction to the principal surface of the piezoelectric substrate 10. More specifically, the connector 40G includes two different layers, that is, a first connector 41G and a second connector 42G. The first connector 41G is a layer that is disposed on the piezoelectric-substrate-10 side of the connector 40G, and has a structure that is similar to the structure of the connector 40E according to the second preferred embodiment. The second connector 42G is a layer that is disposed on the cover-layer-20 side of the connector 41G. The material of the second connector 42G is not particularly limited to certain materials. The second connector 42G is used to, for example, increase fluid tightness of a space above the IDT electrode 13.

The other effects of the surface acoustic wave device 1G according to this modification are similar to those of the surface acoustic wave device 1E according to the second preferred embodiment.

Third Modification of Second Preferred Embodiment

Next, a surface acoustic wave device according to a third modification of the second preferred embodiment is described with reference to the drawings.

Figure 12:
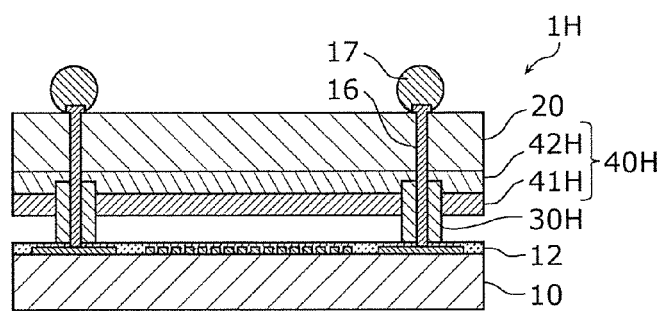
FIG. 12 is a sectional view of a surface acoustic wave device according to a third modification of the second preferred embodiment of the present invention.

FIG. 12 is a sectional view of a surface acoustic wave device 1H according to this modification.

As shown in FIG. 12, the surface acoustic wave device 1H according to this modification differs from the surface acoustic wave device 1E according to the second preferred embodiment in the structure of a connector 40H and the structure of a support 30H. The other structural features are the same. Similarly to the surface acoustic wave device 1G according to this modification, the connector 40H according to this modification includes two different layers, that is, a first connector 41H and a second connector 42H. The support 30H extends through the first connector 41H and is embedded in the second connector 42H.

The surface acoustic wave device 1H according to this modification achieves similar effects to those of the surface acoustic wave device 1G according to the second modification.

Fourth Modification of Second Preferred Embodiment

Next, a surface acoustic wave device according to a fourth modification of the second preferred embodiment is described with reference to the drawings.

Figure 13:
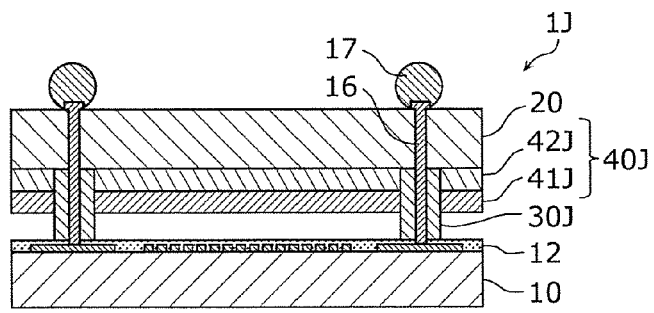
FIG. 13 is a sectional view of a surface acoustic wave device according to a fourth modification of the second preferred embodiment of the present invention.

FIG. 13 is a sectional view of a surface acoustic wave device 1J according to this modification.

As shown in FIG. 13, the surface acoustic wave device 1J according to this modification differs from the surface acoustic wave device 1E according to the second preferred embodiment in the structure of a connector 40J and the structure of a support 30J. The other structural features are the same. Similarly to the surface acoustic wave devices 1G and 1H according to the modifications, the connector 40J according to this modification includes two different layers, that is, a first connector 41J and a second connector 42J. The support 30J extends through the first connector 41J and the second connector 42J and contacts the cover layer 20.

The surface acoustic wave device 1J according to this modification achieves similar effects to those of the surface acoustic wave devices 1G and 1H according to the modifications.

Fifth Modification of Second Preferred Embodiment

Next, a surface acoustic wave device according to a fifth modification of the second preferred embodiment is described with reference to the drawings.

Figure 14:
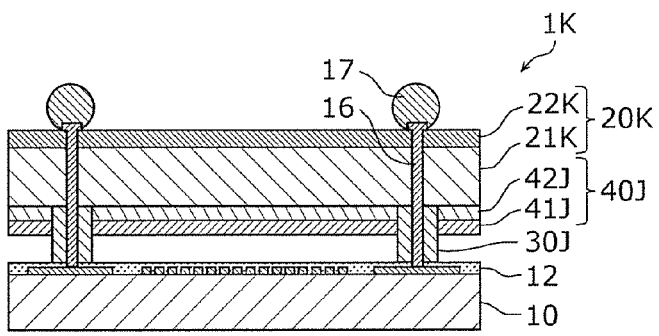
FIG. 14 is a sectional view of a surface acoustic wave device according to a fifth modification of the second preferred embodiment of the present invention.

FIG. 14 is a sectional view of a surface acoustic wave device 1K according to this modification.

As shown in FIG. 14, the surface acoustic wave device 1K according to this modification differs from the surface acoustic wave device 1J according to the fourth modification of the second preferred embodiment in the structure of a cover layer 20K. The other structural features are the same. The cover layer 20K according to this modification includes a plurality of layers that are laminated in the normal direction to the principal surface of the piezoelectric substrate 10. More specifically, the cover layer 20K includes two different layers, that is, a first cover layer 21K and a second cover layer 22K. The first cover layer 21K is a layer that is disposed the piezoelectric-substrate-10 side of the cover layer 20K, and has a structure that is similar to the structure of the cover layers 20 according to the first and second preferred embodiments. The second cover layer 22K is a layer that is disposed on an upper surface (that is, the far side from the piezoelectric substrate 10) of the first cover layer 21K in FIG. 14. The material of the second cover layer 22K is not particularly limited to certain materials. The second cover layer 22K is used to, for example, increase fluid tightness of a space above the IDT electrode 13. The second cover layer 22K may be used for printing or inscribing a product number or the like on the surface acoustic wave device 1K.

The surface acoustic wave device 1K according to this modification achieves similar effects to those of the surface acoustic wave devices 1G, 1H, and 1J according to the modifications.

Sixth Modification of Second Preferred Embodiment

Next, a surface acoustic wave device according to a sixth modification of the second preferred embodiment is described with reference to the drawings.

Figure 15:
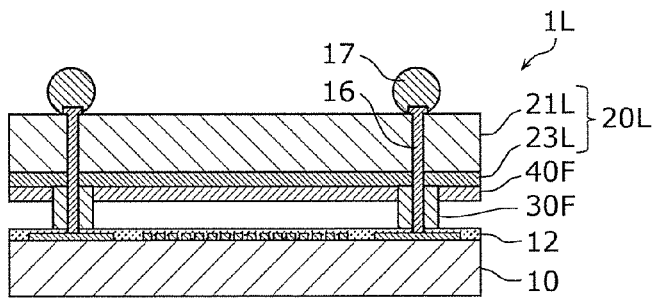
FIG. 15 is a sectional view of a surface acoustic wave device according to a sixth modification of the second preferred embodiment of the present invention.

FIG. 15 is a sectional view of a surface acoustic wave device 1L according to this modification.

As shown in FIG. 15, the surface acoustic wave device 1L according to this modification differs from the surface acoustic wave device 1F according to the first modification of the second preferred embodiment in the structure of a cover layer 20L. The other structural features are the same. The cover layer 20L according to this modification includes a plurality of layers that are laminated in the normal direction to the principal surface of the piezoelectric substrate 10. More specifically, the cover layer 20L includes two different layers, that is, a first cover layer 21L and a third cover layer 23L. The first cover layer 21L is a layer that is disposed on an upper side (the far side from the piezoelectric substrate 10) of the cover layer 20L in FIG. 15, and has a structure that is similar to the structures of the cover layers 20 according to the first and second preferred embodiments. The third cover layer 23L is a layer that is disposed on a piezoelectric-substrate-10-side surface of the first cover layer 21L in FIG. 15. The material of the third cover layer 23L is not particularly limited to certain materials as long as the Young's modulus of the material is higher than the Young's modulus of the support 30F. The third cover layer 23L is used for, for example, increasing fluid tightness of a space above the IDT electrode 13.

The surface acoustic wave device 1L according to this modification also achieves similar effects to those of the surface acoustic wave device 1F according to the above-described modification.

Seventh Modification of Second Preferred Embodiment

Next, a surface acoustic wave device according to a seventh modification of the second preferred embodiment is described with reference to the drawings.

Figure 16:
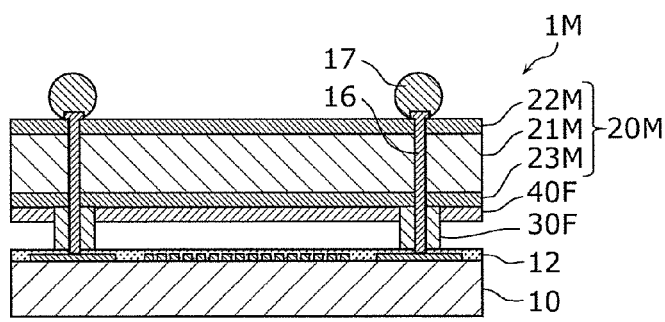
FIG. 16 is a sectional view of a surface acoustic wave device according to a seventh modification of the second preferred embodiment of the present invention.
Figure 17:
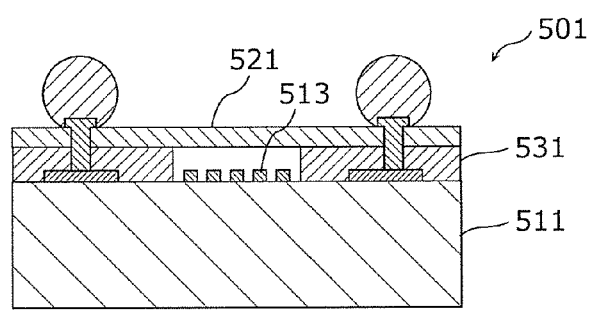
FIG. 17 is a sectional view of a surface acoustic wave device having a WLP structure disclosed in International Publication No. 2009/116222.
Figure 18:
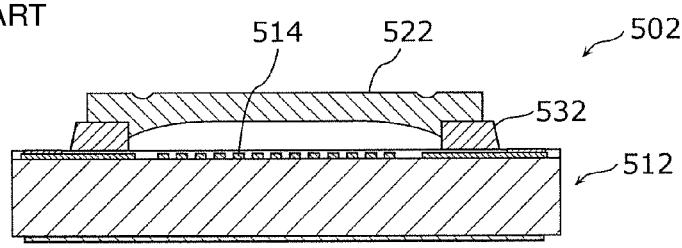
FIG. 18 is a sectional view of a surface acoustic wave device having a WLP structure disclosed in Japanese Unexamined Patent Application Publication No. 2014-7727.

FIG. 16 is a sectional view of a surface acoustic wave device 1M according to this modification.

As shown in FIG. 16, the surface acoustic wave device 1M according to this modification differs from the surface acoustic wave device 1L according to the sixth modification of the second preferred embodiment in the structure of a cover layer 20M. The other structural features are the same. The cover layer 20M according to this modification includes a plurality of layers that are laminated in the normal direction to the principal surface of the piezoelectric substrate 10. More specifically, the cover layer 20M includes a first cover layer 21M, a second cover layer 22M, and a third cover layer 23M.

The first cover layer 21M is a layer that is disposed near the center of the cover layer 20M in a thickness direction thereof, and has a structure that is similar to the structures of the cover layers 20 according to the first and second preferred embodiments.

The second cover layer 22M is a layer that is disposed on an upper surface (that is, the far side from the piezoelectric substrate 10) of the first cover layer 21M in FIG. 16, and has a structure that is similar to the structure of the second cover layer 22K according to the fifth modification of the second preferred embodiment.

The third cover layer 23M is a layer that is disposed on a piezoelectric-substrate-10-side surface of the first cover layer 21M in FIG. 16, and has a structure that is similar to the structure of the third cover layer 23L according to the sixth modification of the second preferred embodiment.

The surface acoustic wave device 1M according to this modification also achieves similar effects to those of the surface acoustic wave devices 1K and 1L according to the above-described modifications.

Other Modifications

Although the surface acoustic wave devices according to the preferred embodiments of the present invention are described, the present invention is not limited to these individual preferred embodiments. For example, the present invention may include the following modifications of the preferred embodiments.

For example, the present invention also includes configurations, structures, forms, etc. including any combinations of characteristic portions of the preferred embodiments and the modifications thereof.

Regarding the method of producing the surface acoustic wave device 1A according to the first preferred embodiment, the method of applying pressure to the cover layer 20 and the connector 40 towards the piezoelectric substrate 10 is described as a method of embedding the support 30 into the connector 40. However, the method of embedding the support 30 into the connector 40 is not limited thereto. For example, it is possible to insert the support 30 in a recessed portion previously formed in a portion of the connector 40 corresponding to the location of the support 30.

Although the surface acoustic wave devices according the above-described preferred embodiments each include the dielectric film 14 that covers the IDT electrode 13 and the wiring electrode 15, the surface acoustic wave devices need not include the dielectric film 14.

In the first preferred embodiment of the present invention, the laminated structure of each connector and the laminated structure of each cover layer according to the second to seventh modifications of the second preferred embodiment may be applied to the first preferred embodiment, for example.

As a small, thin surface acoustic wave device, preferred embodiments of the present invention are widely applicable to communication apparatuses, such as cellular phones, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A surface acoustic wave device comprising:
a piezoelectric substrate including one principal surface;
an electrode provided on the one principal surface of the piezoelectric substrate and that excites a surface acoustic wave;
a cover layer that is disposed at a location opposing the one principal surface and that covers the electrode;
a support that is provided in a standing manner around the electrode on the one principal surface, and that, with the cover layer separated from the electrode, supports a piezoelectric-substrate-side surface of the cover layer; and
a connector that is provided on the piezoelectric-substrate-side surface of the cover layer and that joins the cover layer and the support to each other; wherein
at least a portion of a cover-layer-side end portion of the support exists within the volume of the connector; and
a dimension of the connector in a normal direction to the one principal surface is less than a dimension of the support in the normal direction.

2. The surface acoustic wave device according to claim 1, wherein a Young's modulus of a material of the support is less than or equal to a Young's modulus of a material of the piezoelectric-substrate-side surface of the cover layer.

3. The surface acoustic wave device according to claim 1, wherein the cover-layer-side end portion of the support has a protruding shape.

4. The surface acoustic wave device according to claim 1, wherein the support contacts the cover layer.

5. The surface acoustic wave device according to claim 1, wherein the support does not contact the cover layer.

6. The surface acoustic wave device according to claim 1, wherein the connector is provided around a region of the piezoelectric-substrate-side surface of the cover layer facing the electrode.

7. The surface acoustic wave device according to claim 1, wherein the connector includes a plurality of layers laminated in the normal direction.

8. The surface acoustic wave device according to claim 1, wherein the cover layer includes a plurality of layers laminated in the normal direction.

9. The surface acoustic wave device according to claim 1, wherein the connector is made of a material containing at least one of epoxy, urethane, phenol, polyester, benzocyclobutene, and polybenzoxazole.

10. The surface acoustic wave device according to claim 1, wherein the support is made of a material containing at least one of polyimide, epoxy, benzocyclobutene, polybenzoxazole, a metal, and silicon oxide.

11. The surface acoustic wave device according to claim 1, wherein the piezoelectric-substrate-side surface of the cover layer is made of a material containing at least one of polyimide, epoxy, benzocyclobutene, polybenzoxazole, silicon, silicon oxide, lithium tantalate, and lithium niobate.

12. The surface acoustic wave device according to claim 1, wherein the cover layer is made of a material that includes at least one of polyimide, epoxy, benzocyclobutene (BCB), polybenzoxazole (PBO), silicon, silicon oxide, $LiTaO_3$, and $LiNbO_3$.

13. The surface acoustic wave device according to claim 1, wherein the support has a ring shape, and the support and the cover layer fluid-tightly close a space between the electrode and the cover layer.

14. The surface acoustic wave device according to claim 1, wherein the support is embedded into the connector.

15. The surface acoustic wave device according to claim 1, wherein the surface acoustic wave device includes a wafer layer package structure.

16. The surface acoustic wave device according to claim 1, wherein the support extends through the connector and contacts the cover layer.

17. The surface acoustic wave device according to claim 1, wherein at least a portion of the cover-layer-side end surface of the support is embedded in the connector.

18. The surface acoustic wave device according to claim 1, wherein the support includes a plurality of supports and the connector includes a plurality of connectors, and each of the plurality of supports and each of the plurality of connectors has a tapering shape.

19. A communication apparatus comprising:
the surface acoustic wave device according to claim 1.

20. The communication apparatus according to claim 19, wherein the communication apparatus is a cellular phone.

\* \* \* \* \*